(12) United States Patent
Peitzsch

(10) Patent No.: US 10,879,038 B1
(45) Date of Patent: Dec. 29, 2020

(54) CONDUCTIVE BEAM OPTIC CONTAINING INTERNAL HEATING ELEMENT

(71) Applicant: APPLIED Materials, Inc., Santa Clara, CA (US)

(72) Inventor: Scott E. Peitzsch, Tewksbury, MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/459,970

(22) Filed: Jul. 2, 2019

(51) Int. Cl.
| | | |
|---|---|---|
| H01J 37/00 | (2006.01) |
| H01J 37/30 | (2006.01) |
| H01J 37/05 | (2006.01) |
| H01J 37/12 | (2006.01) |
| H01J 37/147 | (2006.01) |
| H01J 37/317 | (2006.01) |

(52) U.S. Cl.
CPC .......... *H01J 37/3007* (2013.01); *H01J 37/05* (2013.01); *H01J 37/12* (2013.01); *H01J 37/147* (2013.01); *H01J 37/3171* (2013.01); *H01J 2237/04756* (2013.01); *H01J 2237/04924* (2013.01); *H01J 2237/1202* (2013.01); *H01J 2237/151* (2013.01)

(58) Field of Classification Search
USPC .......................................... 250/395 R, 396 R
See application file for complete search history.

(56) References Cited

U.S. PATENT DOCUMENTS

| | | | | |
|---|---|---|---|---|
| 8,003,500 | B2 * | 8/2011 | Vellaikal | H01J 37/32412 438/513 |
| 8,519,353 | B2 * | 8/2013 | Radovanov | H01J 37/12 250/396 R |
| 8,907,295 | B2 * | 12/2014 | Naumovski | H01J 37/3171 250/396 R |
| 10,665,415 | B1 * | 5/2020 | Likhanskii | H01J 37/05 |

* cited by examiner

*Primary Examiner* — Phillip A Johnston

(57) ABSTRACT

Provided herein are approaches for reducing particles in an ion implanter. In some embodiments, an electrostatic filter of the ion implanter may include a housing and a plurality of conductive beam optics within the housing, the plurality of conductive beam optics arranged around an ion beam-line. At least one conductive beam optic of the plurality of conductive beam optics may include a conductive core element, a resistive material disposed around the conductive core, and a conductive layer disposed around the resistive material.

20 Claims, 5 Drawing Sheets

CONDUCTIVE BEAM OPTIC CONTAINING INTERNAL HEATING ELEMENT

FIELD OF THE DISCLOSURE

The disclosure relates generally to ion implanters, and more particularly, to conductive beam optics with uniform voltage along a length to improve performance of an electrostatic filter.

BACKGROUND OF THE DISCLOSURE

Ion implantation is a process of introducing dopants or impurities into a substrate via bombardment. In semiconductor manufacturing, the dopants are introduced to alter electrical, optical, or mechanical properties. For example, dopants may be introduced into an intrinsic semiconductor substrate to alter the type and level of conductivity of the substrate. In manufacturing an integrated circuit (IC), a precise doping profile provides improved IC performance. To achieve a desired doping profile, one or more dopants may be implanted in the form of ions in various doses and various energy levels.

Ion implantation systems may comprise an ion source and a series of beam-line components. The ion source may comprise a chamber where desired ions are generated. The ion source may also comprise a power source and an extraction electrode assembly disposed near the chamber. The beam-line components may include, for example, a mass analyzer, a first acceleration or deceleration stage, a collimator, and a second acceleration or deceleration stage. Much like a series of optical lenses for manipulating a light beam, the beam-line components can filter, focus, and manipulate ions or ion beam having desired species, shape, energy, and other qualities. The ion beam passes through the beam-line components and may be directed toward a substrate or wafer mounted on a platen or clamp. The substrate may be moved in one or more dimensions (e.g., translate, rotate, and tilt) by an apparatus, sometimes referred to as a roplat.

The ion implanter generates a stable, well-defined ion beam for a variety of different ion species and extraction voltages. After several hours of operation using source gases (such as $AsH_3$, $PH_3$, $BF_3$, and other species), beam constituents eventually create deposits on the beam optics. Beam optics within a line-of-sight of the wafer also become coated with residues from the wafer, including Si and photoresist compounds. These residues build up on the beam-line components, causing spikes in the DC potentials during operation (e.g., in the case of electrically biased components). Eventually the residues flake off, causing an increased likelihood of particulate contamination on the wafer.

One way to prevent the effect of the material accumulation is to intermittently replace beam-line components of the ion implanter system. Alternatively, beam-line components may be manually cleaned, including powering down the ion source, and releasing the vacuum within the system. In yet another approach, electrodes of the ion implanter system may be heated to reduce the number of particles generated thereupon. This presents a design challenge however, as the electrodes are at potential. Past approaches for heating the electrodes includes passing current through a long axis of the electrodes, which causes an undesired voltage gradient across the ion beam (e.g., ribbon beam).

SUMMARY

In view of the foregoing, provided herein are systems and methods for configuring a one or more conductive beam optics within an electrostatic filter to reduce particle build-up within the electrostatic filter by heating the one or more conductive beam optics with a current passed coaxially. In one or more embodiments, the electrostatic filter of the ion implanter may include a housing and a plurality of conductive beam optics within the housing, the plurality of conductive beam optics arranged around an ion beam-line. At least one conductive beam optic of the plurality of conductive beam optics may include a conductive core element, a resistive material disposed around the conductive core element, and a conductive layer disposed around the resistive material.

In one or more embodiments, a conductive beam optic may include a conductive core element, a resistive material disposed around the conductive core element, and a conductive layer disposed around the resistive material.

In one or more embodiments, an ion implantation system may include an electrostatic filter for delivering an ion beam to a wafer. The electrostatic filter may include a housing and a plurality of conductive beam optics within the housing, wherein the plurality of conductive beam optics is arranged around an ion beam-line. At least one conductive beam optic of the plurality of conductive beam optics may include a conductive core element, a resistive material disposed around the conductive core element, and a conductive layer disposed around the resistive material.

BRIEF DESCRIPTION OF THE DRAWINGS

The accompanying drawings illustrate example approaches of the disclosure, including the practical application of the principles thereof, as follows.

Figure 1:
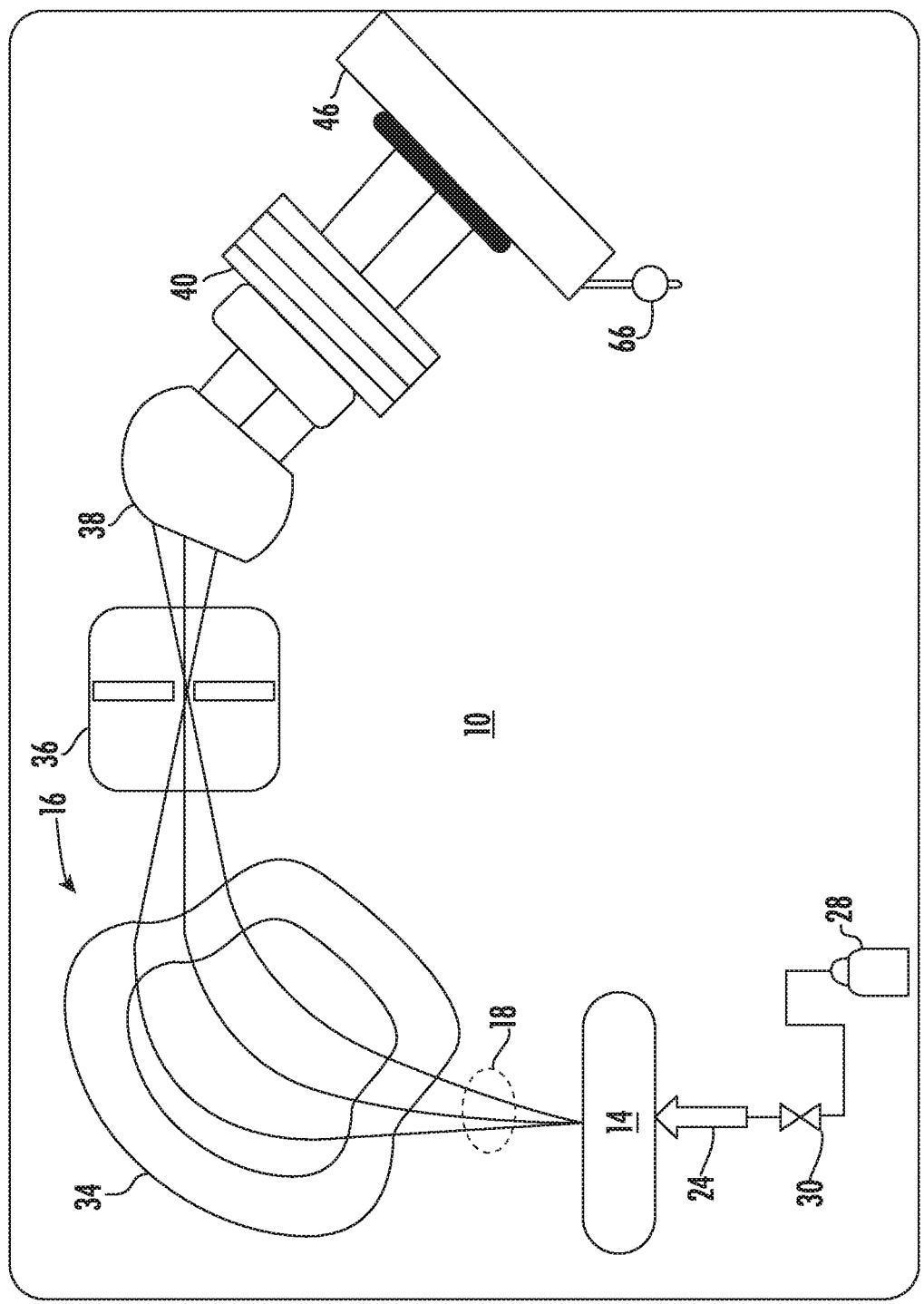
FIG. 1 is a schematic view illustrating an ion implantation system in accordance with embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements. Furthermore, certain elements in some of the figures may be omitted, or illustrated not-to-scale, for illustrative clarity. Still furthermore, for clarity, some reference numbers may be omitted in certain drawings.

DETAILED DESCRIPTION

An electrostatic filter, conductive beam optic, and ion implantation system in accordance with the present disclosure will now be described more fully hereinafter with reference to the accompanying drawings, where embodiments of the system and method are shown. The electrostatic filter, conductive beam optic, and ion implantation system may be embodied in many different forms and are not be construed as being limited to the embodiments set forth herein. Instead, these embodiments are provided so the disclosure will be thorough and complete, and will fully convey the scope of the system and method to those skilled in the art.

For the sake of convenience and clarity, terms such as "top," "bottom," "upper," "lower," "vertical," "horizontal," "lateral," and "longitudinal" will be used herein to describe the relative placement and orientation of various components and their constituent parts, as appearing in the figures. The terminology will include the words specifically mentioned, derivatives thereof, and words of similar import.

As used herein, an element or operation recited in the singular and proceeded with the word "a" or "an" are understood as not excluding plural elements or operations, until such exclusion is explicitly recited. Furthermore, references to "one embodiment" of the present disclosure are not intended to be interpreted as excluding the existence of additional embodiments also incorporating the recited features.

The embodiments of the present disclosure allow one or more electrode rods of an electrostatic filter to act as heaters, while leaving a voltage field undisturbed. Past efforts have considered passing current through the long axis of the electrode rods, which often causes an undesired voltage gradient across the ribbon beam. The embodiments herein provide a central conductor within the electrode rod so current can be passed coaxially within the electrode rod. In some embodiments, the electrode rod may be coupled to a power source that is referenced to an output of a filter power supply, or integrated into the filter power supply.

In some embodiments, an electrostatic filter may include a housing and a plurality of conductive beam optics within the housing. The conductive beam optics are arranged around an ion beam-line directed towards a wafer. In some embodiments, one or more conductive beam optics of the electrostatic filter may include a conductive core element, and a resistive material disposed around the conductive core. A conductive layer may be disposed around the resistive material.

Referring now to FIG. 1, an exemplary embodiment of an ion implantation system in accordance with the present disclosure is shown. The ion implantation system (hereinafter "system") 10 represents a process chamber containing, among other components, an ion source 14 for producing an ion beam 18, an ion implanter, and a series of beam-line components. The ion source 14 may comprise a chamber for receiving a flow of gas 24 and generates ions. The ion source 14 may also comprise a power source and an extraction electrode assembly disposed near the chamber. The beam-line components 16 may include, for example, a mass analyzer 34, a first acceleration or deceleration stage 36, a collimator 38, and an electrostatic filter (hereinafter "filter") 40 corresponding to a second acceleration or deceleration stage.

In exemplary embodiments, the beam-line components 16 may filter, focus, and manipulate ions or the ion beam 18 to have a particular species, shape, energy, and/or other qualities. The ion beam 18 passing through the beam-line components 16 may be directed toward a substrate mounted on a platen or clamp within a process chamber 46. The substrate may be moved in one or more dimensions (e.g., translate, rotate, and tilt).

As shown, there may be one or more feed sources 28 operable with the chamber of the ion source 14. In some embodiments, material provided from the feed source 28 may include source material and/or additional material. The source material may contain dopant species introduced into the substrate in the form of ions. Meanwhile, the additional material may include diluent, introduced into the ion source chamber of the ion source 14 along with the source material to dilute the concentration of the source material in the chamber of the ion source 14. The additional material may also include a cleaning agent (e.g., an etchant gas) introduced into the chamber of the ion source 14 and transported within the system 10 to clean one or more of the beam-line components 16.

In various embodiments, different species may be used as the source and/or the additional material. Examples of the source and/or additional material may include atomic or molecular species containing boron (B), carbon (C), oxygen (O), germanium (Ge), phosphorus (P), arsenic (As), silicon (Si), helium (He), neon (Ne), argon (Ar), krypton (Kr), nitrogen (N), hydrogen (H), fluorine (F), and chlorine (Cl). Those of ordinary skill in the art will recognize the above listed species are non-limiting, and other atomic or molecular species may also be used. Depending on the application(s), the species may be used as the dopants or the additional material. In particular, one species used as the dopants in one application may be used as the additional material in another application, or vice-versa.

In exemplary embodiments, the source and/or additional material is provided into the ion source chamber of the ion source 14 in gaseous or vapor form. If the source and/or additional material is in non-gaseous or non-vapor form, a vaporizer (not shown) may be provided near the feed source 28 to convert the material into gaseous or vapor form. To control the amount and the rate the source and/or the additional material is provided into the system 10, a flowrate controller 30 may be provided.

The filter 40 may be a beam-line component configured to independently control deflection, deceleration, and focus of the ion beam 18. In some embodiments, the filter 40 may be a vertical electrostatic energy filter (VEEF). In other embodiments, the filter 40 is an electrostatic lens of a dual magnet ribbon beam high current ion implanter. As will be described in greater detail below, the filter 40 may include an electrode configuration comprising a set of upper electrodes disposed above the ion beam 18 and a set of lower electrodes disposed below the ion beam 18. The set of upper electrodes and the set of lower electrodes may be stationary and have fixed positions. A difference in potentials between the set of upper electrodes and the set of lower electrodes may also be varied along the ion beam trajectory to reflect an energy of the ion beam at various point along the ion beam trajectory for independently controlling deflection, deceleration, and/or focus of an ion beam.

Figure 2:
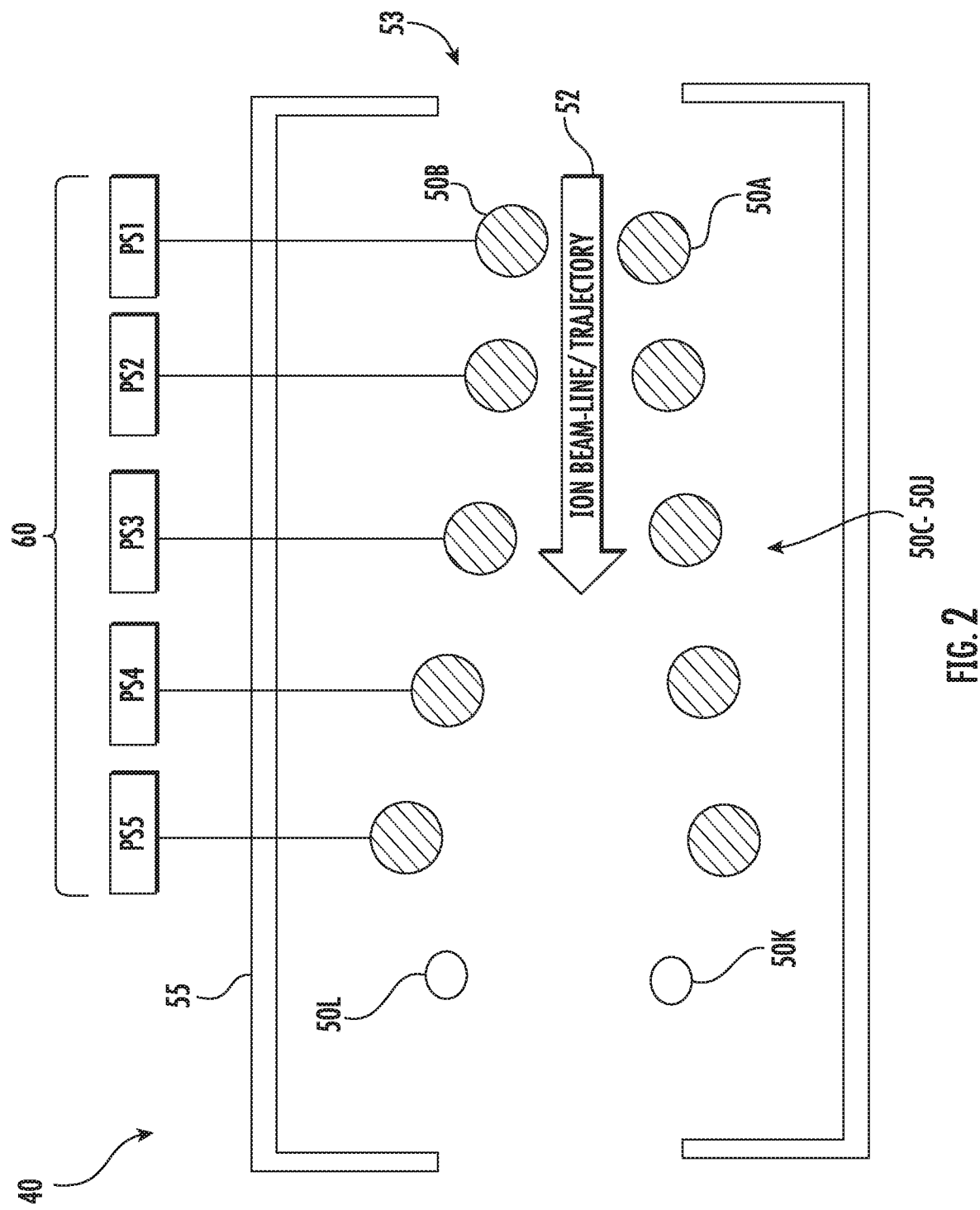
FIG. 2 is a side cross-sectional view illustrating an electrostatic filter of the ion implantation system of FIG. 1 in accordance with embodiments of the present disclosure.

Referring now to FIG. 2, the filter 40 according to embodiments of the present disclosure will be described in greater detail. As shown, the filter 40 may include a plurality of conductive beam optics 50A-L, such as a plurality of graphite electrode rods, disposed along opposite sides of an ion beam line/trajectory 52. The ion beam is delivered through the filter 40, along ion beam line/trajectory 52, entering at an entrance aperture 53 of a housing 55, and exiting at an exit 47 for impact with a wafer (not shown). As shown, the plurality of conductive beam optics 50A-L provide a space/opening to allow the ion beam (e.g., a ribbon beam) to pass therethrough. As described above, the vacuum pump 66 (FIG. 1) may be directly or indirectly connected to the housing 55 for adjusting a pressure of an environment therein.

In exemplary embodiments, the conductive beam optics 50A-L include pairs of conductive pieces electrically coupled to each other. As shown, each electrode pair may be connected to respective power sources 60 (e.g., PS1-PS5). For example, conductive beam optics 50A-50B may both be connected to the PS1. Alternatively, the conductive beam optics 50A-L may be a series of unitary structures each including an aperture for the ion beam to pass therethrough. In the embodiment shown, upper and lower portions of each electrode pair may have different potentials (e.g., in separate conductive pieces) in order to deflect the ion beam passing therethrough. Although the plurality of conductive beam optics 50A-L are depicted as including twelve (12) elements, a different number of elements (or electrodes) may be utilized. For example, the configuration of conductive beam optics 50A-L may utilize a range of three (3) to ten (10) electrode sets.

In some embodiments, the filter 40 may be in situ cleaned during a cleaning mode to remove back sputter material formed upon an exterior surface of one or more of the conductive beam optics 50A-L. To accomplish the cleaning, an etchant gas (e.g., $H_2$ or $O_2$) may be introduced into the filter 40 at a selected flow/injection rate from a gas supply component (not shown). In exemplary embodiments, the gas supply component may be a gas bleed device including a conduit having plurality of apertures formed therein to allow the etchant gas to be distributed within the filter 40. For example, through the gas bleed device, 1 to 5 standard cubic centimeters per minute (SCCM) of gas such as $O_2$ or $H_2$ may be introduced into the housing 55 to chemically etch away the depositions of the back-sputter material. Embodiments herein are not limited in this respect.

Various species may be introduced as the cleaning agent of the etchant gas. The cleaning agent may be atomic or molecular species containing chemically reactive species. Such species, when ionized, may chemically react with the deposits accumulated on one or more of the conductive beam optics 50A-L. Although a cleaning agent with chemically reactive species will be described herein, the present disclosure does not preclude utilizing chemically inert species. In another embodiment, the cleaning agent may contain heavy atomic species to form ions with high atomic mass units (amu) when ionized. Non-limiting examples of the cleaning agent may include atomic or molecular species containing H, He, N, O, F, Ne, Cl, Ar, Kr, and Xe, or a combination thereof. In one embodiment, $NF_3$, $O_2$, or a mixture of Ar and $F_2$, or a combination thereof, may be used as the cleaning agent.

The composition of the etchant gas can be chosen to optimize chemical etching based on a composition of the deposit(s) formed on the conductive beam optics 50A-L. For example, fluorine-based plasmas may be used to etch beam components containing B, P, and As, while oxygen-based plasmas may be used to etch photoresist materials. In one embodiment, adding Ar or other heavy species to the plasma mixture increases ion bombardment, resulting in an improved removal rate of the deposit(s) from the conductive beam optics 50A-L when using a chemically enhanced ion sputtering process. Plasma or ion bombardment also provokes heating of the surfaces to aid chemical etch rates and to help agitate the deposit(s) from the surface of the conductive beam optics 50A-L.

Figure 3A:
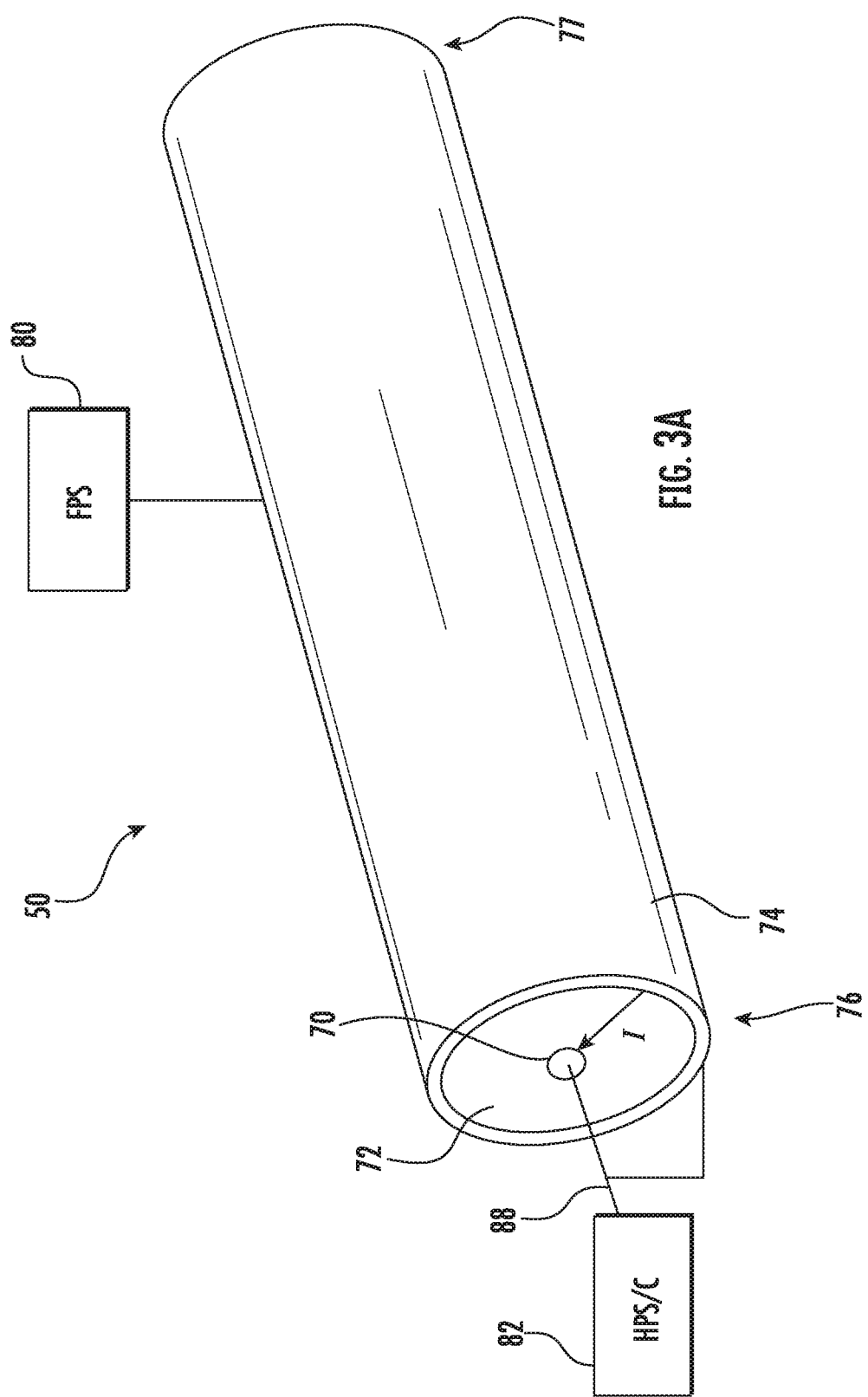
FIG. 3A is a perspective view a conductive beam optic in accordance with embodiments of the present disclosure.
Figure 3B:
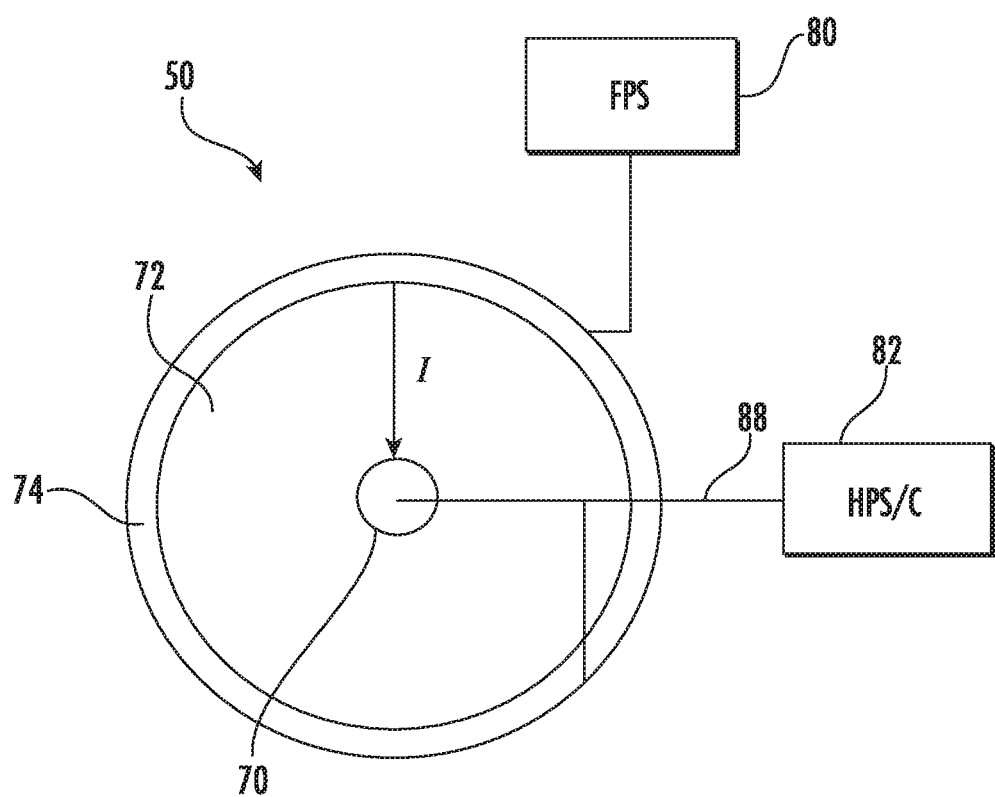
FIG. 3B is an end view the conductive beam optic of FIG. 3A in accordance with embodiments of the present disclosure.

Turning now to FIGS. 3A-3B, an example of a conductive beam optic 50 according to embodiments of the present disclosure will be described in greater detail. As shown, the conductive beam optic 50 may include a conductive core element 70 and a resistive material 72 disposed around the conductive core element 70. A conductive layer 74 may be disposed around the resistive material 72. In some embodiments, the resistive material 72 may be concentrically formed around the conductive core element 70, and the conductive layer 74 may be concentrically formed around the resistive material 72, for example, by deposition. The conductive core element 70 may extend between a first end 76 and a second end 77 of the conductive beam optic 50.

Although non-limiting, the conductive core element 70 may be made from aluminum, stainless steel, and/or tungsten, and the resistive material 72 may be made from graphite, carbon, and/or carbon ceramics. In some embodiments, the graphite of the resistive material 72 may be doped or undoped. Additionally, the conductive layer 74 may also include a graphite doped with, for example, tungsten. In embodiments where both the resistive material 72 and the conductive layer 74 are both made from a doped graphite, it will be appreciated that the conductive layer 74 may have a higher conductance than the resistive layer 72.

The conductive beam optic 50 may represent one or more of conductive beam optics 50A-L shown in the filter 40 of FIG. 2. In some embodiments, each of the conductive beam optics 50A-L includes the conductive core element 70 and/or the conductive layer 74. In other embodiments, a subset of the plurality of conductive beam optics 50A-L may include the conductive core element 70 and/or the conductive layer 74. Embodiments herein are not limited in this context.

As further shown, the conductive beam optic 50 may further include a filter power supply (FPS) 80 connected to the conductive layer 74, and a heater power supply/controller (HPS/C) 82 connected to the conductive core element 70 and to the conductive layer 74 via a transformer 88. In some embodiments, the FPS 80 and the HPS/C 82 are individually adjustable to control a voltage and a current supplied to the conductive layer 74 and the conductive core element 70, respectively. During use, a current I can be passed coaxially from the conductive layer 74 to the core element 70. Unlike prior art approaches in which current is delivered through the long axis of the rods, resulting in an undesired voltage gradient across a resultant ribbon beam, the conductive beam optic 50 of the present embodiments retain any voltage gradient within an interior thereof. As a result, a voltage along a length of the conductive beam optic, e.g., between the first end 76 and the second end 77, may be substantially uniform. Stated differently, a change in voltage observed along the length of the conductive beam optic 50, for example, due to the resistive material 72, is minimal.

During use, as a result of the elevated temperature of the conductive core element 70 and/or the conductive layer 74, the conductive beam optic may evaporate any solid back sputter material forming upon an exterior surface of the conductive layer 74. In one non-limiting embodiment, the conductive core element 70 and/or the conductive layer 74 may raise the temperature of the conductive beam optic 50 to approximately 200° C. to 900° C.

Figure 4:
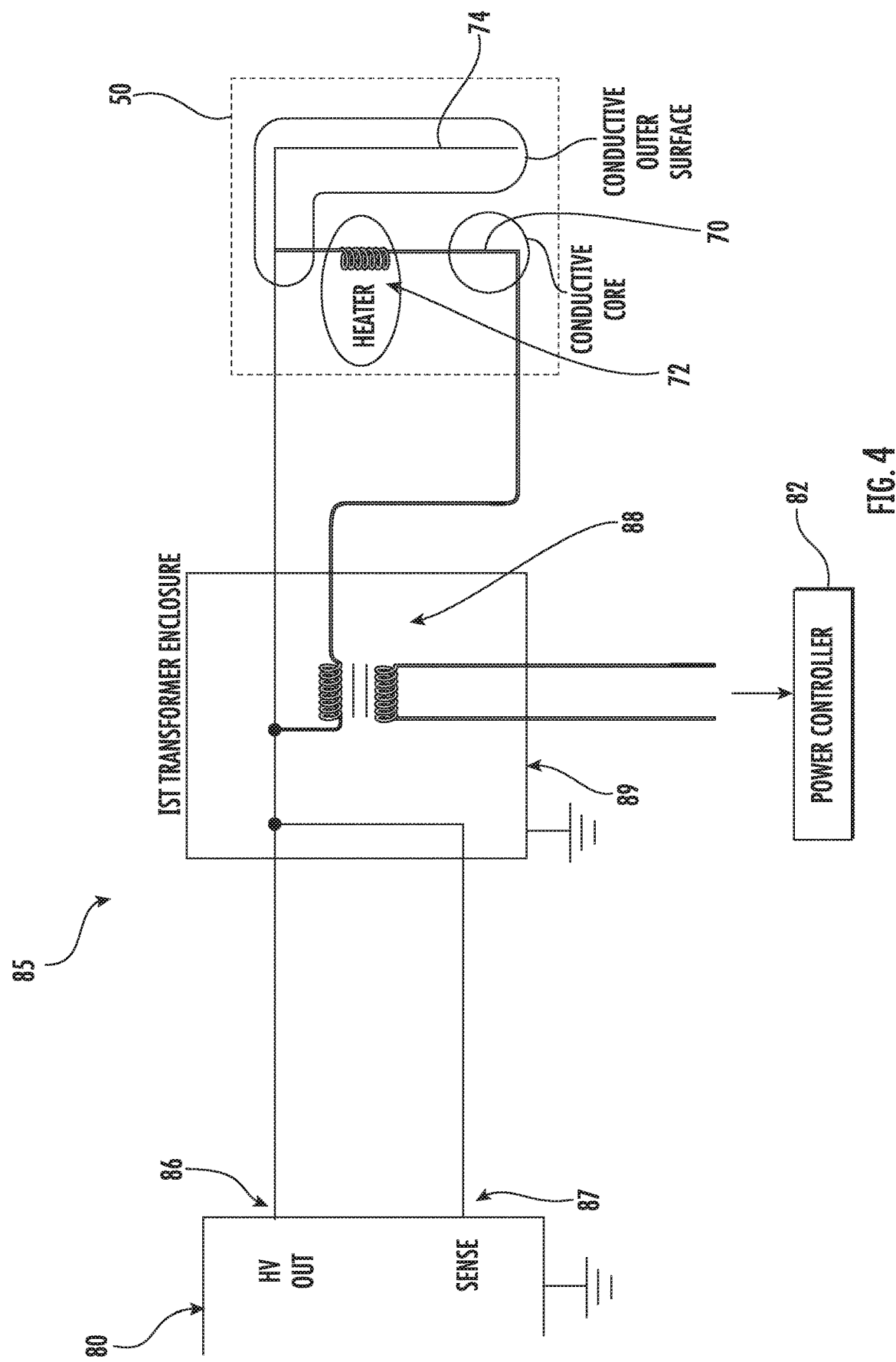
FIG. 4 is a schematic view illustrating an exemplary conductive beam optic in accordance with embodiments of the present disclosure.

Turning now to FIG. 4, a schematic diagram of an electrical system 85 operable to supply the conductive beam optic 50 with a voltage and a current according to embodiments of the present disclosure will be described in greater detail. As shown, the electrical system 85 may include the FPS 80, which may include a high voltage (HV) output 86 and a voltage sense connection 87. The HV output 86 may apply the high voltage to the conductive beam optic 50 in order to steer/filter the ion beam, while the voltage sense connection 87 may ensure no break in the connection from the high voltage (HV) output 86 to the conductive beam optic 50. In this embodiment, the FPS 80 is connected to the HPS/C 82, which may be referenced to the HV output 86. In other embodiments, the HPS 82 may be integrated into the FPS 80.

As shown, the electrical system may include the transformer 88, such as magnetically coupled transformer including first and second windings, the transformer located within an enclosure 89, wherein the enclosure 89 may further include various connections for the FPS 80. The transformer 88 may allow the HPS/C 82 to be at ground potential. In some embodiments, the transformer 88 may be connected between the HPS/C 82 and the conductive core element 70 of the conductive beam optic 50. Connected to the conductive core element 70 is a resistor, such as the resistive material 72. The conductive layer 74 is shown connected to the resistive material 72 and to the FPS 80. It will be appreciated that the electrical system 85 represents but one possible implementation of the conductive beam optic 50.

In view of the foregoing, at least the following advantages are achieved by the embodiments disclosed herein. In a first advantage, one or more of the conductive beam optics of the filter may include an internal heating element (e.g., the conductive layer) operable to evaporate back-sputter material into gaseous form to be pumped out of the filter housing. In a second advantage, the axial direction of the current resulting from the conductive core element and the conductive layer eliminates or reduces undesired voltage gradient across the ribbon beam.

While certain embodiments of the disclosure have been described herein, the disclosure is not limited thereto, as the disclosure is as broad in scope as the art will allow and the specification may be read likewise. Therefore, the above description are not to be construed as limiting. Those skilled in the art will envision other modifications within the scope and spirit of the claims appended hereto.

What is claimed is:

1. An electrostatic filter for delivering an ion beam to a wafer, the electrostatic filter comprising:
   a housing; and
   a plurality of conductive beam optics within the housing, the plurality of conductive beam optics arranged around an ion beam-line, wherein at least one conductive beam optic of the plurality of conductive beam optics comprises:
   a conductive core element;
   a resistive material disposed around the conductive core element; and
   a conductive layer disposed around the resistive material, wherein in use a current is passed coaxially from the conductive layer to the conductive core element.

2. The electrostatic filter of claim 1, wherein the conductive core element includes at least one of: aluminum, stainless steel, and tungsten, wherein the resistive material includes at least one of: graphite, carbon, and carbon ceramics, and wherein the conductive layer includes a doped graphite.

3. The electrostatic filter of claim 1, wherein the resistive material is concentrically disposed atop the conductive core element, and wherein the conductive layer is concentrically disposed atop the resistive material.

4. The electrostatic filter of claim 1, further comprising a first power supply and a second power supply, wherein the first power supply is connected to the conductive layer, and wherein the second power supply is connected to the conductive core element.

5. The electrostatic filter of claim 4, wherein the first power supply and the second power supply are individually adjustable to control a voltage and a current supplied to each of the conductive layer and the conductive core element.

6. The electrostatic filter of claim 1, the plurality of conductive beam optics comprising a set of upper electrodes disposed above an ion beam line and a set of lower electrodes disposed below the ion beam line.

7. The electrostatic filter of claim 1, wherein the conductive core element includes undoped graphite.

8. A conductive beam optic, comprising:
   a conductive core element;
   a resistive material disposed around the conductive core element; and
   a conductive layer disposed around the resistive material, wherein in use a current is passed coaxially from the conductive layer to the conductive core element.

9. The conductive beam optic of claim 8, wherein the conductive core element includes at least one of: aluminum, stainless steel, and tungsten, and wherein the resistive material includes at least one of: graphite, carbon, and carbon ceramics.

10. The conductive beam optic of claim 9, wherein the graphite of the resistive material is a doped graphite.

11. The conductive beam optic of claim 9, wherein the conductive layer includes a doped graphite, and wherein a conductance of the doped graphite of the conductive layer is higher than a conductance of the doped graphite of the resistive material.

12. The conductive beam optic of claim 8, wherein the resistive material is concentrically disposed atop the conductive core element, and wherein the conductive layer is concentrically disposed atop the resistive material.

13. The conductive beam optic of claim 8, wherein the conductive layer is connected to a first power supply, wherein the conductive core element is coupled to a second power supply, and wherein the first power supply and the second power supply are individually adjustable to control a voltage and a current supplied to each of the conductive layer and the conductive core element.

14. An ion implantation system, comprising:
   an electrostatic filter for delivering an ion beam to a wafer, the electrostatic filter comprising:
   a housing; and
   a plurality of conductive beam optics within the housing, the plurality of conductive beam optics arranged around an ion beam-line, wherein at least one conductive beam optic of the plurality of conductive beam optics comprises:
   a conductive core element;
   a resistive material disposed around the conductive core element; and
   a conductive layer disposed around the resistive material, wherein in use a current is passed coaxially from the conductive layer to the conductive core element.

15. The ion implantation system of claim 14, wherein the conductive core element includes at least one of: aluminum, stainless steel, and tungsten, wherein the resistive material includes at least one of: graphite, carbon, and carbon ceramics, and wherein the conductive layer includes a doped graphite.

16. The ion implantation system of claim 14, wherein the resistive material is concentrically disposed atop the conductive core element, and wherein the conductive layer is concentrically disposed atop the resistive material.

17. The ion implantation system claim 14, further comprising a first power supply and a second power supply, wherein the first power supply is connected to the conductive layer, and wherein the second power supply is connected to the conductive core element.

18. The ion implantation system of claim 17, wherein the first power supply and the second power supply are individually adjustable to control a voltage and a current supplied to each of the conductive layer and the conductive core element.

19. The ion implantation system of claim 14, the plurality of conductive beam optics comprising a set of upper electrodes disposed above an ion beam line and a set of lower electrodes disposed below the ion beam line.

20. The ion implantation system of claim 14, wherein the conductive core element includes undoped graphite.

* * * * *